(12) United States Patent
Samuels et al.

(10) Patent No.: US 8,409,379 B2
(45) Date of Patent: *Apr. 2, 2013

(54) MULTILAYER STRUCTURES CONTAINING A FLUORINATED COPOLYMER RESIN LAYER AND AN ETHYLENE TERPOLYMER LAYER

(75) Inventors: Sam Louis Samuels, Landenberg, PA (US); George Wyatt Prejean, Orange, TX (US)

(73) Assignee: E I du Pont de Nemours and Company, Wilmington, DE (US)

( * ) Notice: Subject to any disclaimer, the term of this patent is extended or adjusted under 35 U.S.C. 154(b) by 304 days.

This patent is subject to a terminal disclaimer.

(21) Appl. No.: 12/847,619

(22) Filed: Jul. 30, 2010

(65) Prior Publication Data

US 2012/0024450 A1 Feb. 2, 2012

(51) Int. Cl.
*B32B 37/02* (2006.01)
*B32B 27/08* (2006.01)
(52) U.S. Cl. .......................... 156/60; 156/326; 428/422
(58) Field of Classification Search .................... 156/60, 156/326; 428/421, 422
See application file for complete search history.

(56) References Cited

U.S. PATENT DOCUMENTS

| | | |
|---|---|---|
| 2,632,921 A | 3/1953 | Kreidl |
| 2,648,097 A | 8/1953 | Kritchever |
| 2,683,894 A | 7/1954 | Kritchever |
| 2,704,382 A | 3/1955 | Kreidl |
| 2,897,183 A | 7/1959 | Christl et al. |
| 3,030,290 A | 4/1962 | Ryan |
| 3,234,062 A | 2/1966 | Morris |
| 3,350,372 A | 10/1967 | Anspon et al. |
| 3,404,134 A | 10/1968 | Rees |
| 3,624,250 A | 11/1971 | Carlson |
| 3,676,181 A | 7/1972 | Kowalewski |
| 3,756,996 A | 9/1973 | Pugh et al. |
| 3,852,136 A | 12/1974 | Plumat et al. |
| 4,029,868 A | 6/1977 | Carlson |
| 4,341,576 A | 7/1982 | Lewis |
| 4,351,931 A | 9/1982 | Armitage |
| 4,385,951 A | 5/1983 | Pressau |
| 4,398,979 A | 8/1983 | Cathers et al. |
| 4,732,814 A | 3/1988 | Hatada et al. |
| 5,028,674 A | 7/1991 | Hatch et al. |
| 5,415,909 A | 5/1995 | Shohi et al. |
| 5,532,066 A | 7/1996 | Latiolais et al. |
| 5,536,347 A | 7/1996 | Moran |
| 5,583,057 A | 12/1996 | Inoue |
| 5,677,404 A | 10/1997 | Blair |
| 5,853,516 A | 12/1998 | Lehto |
| 6,075,202 A | 6/2000 | Mori et al. |
| 6,204,443 B1 | 3/2001 | Kiso et al. |
| 6,320,115 B1 | 11/2001 | Kataoka et al. |
| 6,323,416 B1 | 11/2001 | Komori et al. |
| 6,342,116 B1 | 1/2002 | Balduin et al. |
| 6,414,236 B1* | 7/2002 | Kataoka et al. ............... 136/251 |
| 6,521,825 B2 | 2/2003 | Miura et al. |
| 6,541,588 B1 | 4/2003 | Kaulbach et al. |
| 6,726,979 B2 | 4/2004 | Friedman et al. |
| 6,753,087 B2 | 6/2004 | Jing et al. |
| 6,762,508 B1 | 7/2004 | Kiso et al. |
| 6,818,819 B2 | 11/2004 | Morizane et al. |
| 6,963,120 B2 | 11/2005 | Shiozaki et al. |
| 6,972,068 B1 | 12/2005 | Kobayashi et al. |
| 7,638,186 B2 | 12/2009 | Hull et al. |
| 2004/0182493 A1 | 9/2004 | Chick |
| 2007/0267059 A1 | 11/2007 | Nishijima et al. |
| 2007/0292685 A1 | 12/2007 | Brothers et al. |
| 2008/0023063 A1 | 1/2008 | Hayes et al. |
| 2008/0023064 A1 | 1/2008 | Hayes et al. |
| 2008/0169023 A1 | 7/2008 | Nishijima et al. |
| 2008/0264471 A1 | 10/2008 | Hayes |
| 2008/0264481 A1 | 10/2008 | Hayes |
| 2009/0120489 A1 | 5/2009 | Nishijima et al. |
| 2009/0151773 A1* | 6/2009 | Hayes et al. .................. 136/251 |
| 2009/0183773 A1 | 7/2009 | Samuels et al. |
| 2009/0255571 A1 | 10/2009 | Xia et al. |
| 2011/0023943 A1 | 2/2011 | Prejean |

FOREIGN PATENT DOCUMENTS

| | | |
|---|---|---|
| CA | 2388107 A1 | 5/2001 |
| EP | 0577985 B1 | 2/1997 |
| EP | 0769818 A2 | 4/1997 |
| EP | 1065731 A2 | 1/2001 |
| EP | 1182710 A1 | 2/2002 |
| FR | 2539419 A1 | 7/1984 |
| JP | 2000186114 A | 7/2000 |
| JP | 2001144313 A | 5/2001 |
| JP | 2004031445 A | 1/2004 |
| JP | 2004058583 A | 2/2004 |
| JP | 2006032308 A | 2/2006 |
| JP | 2006190867 A | 7/2006 |
| WO | 199101880 A1 | 2/1991 |
| WO | 2003057478 A | 7/2003 |
| WO | 2004019421 A1 | 3/2004 |
| WO | 2009/046048 A1 | 4/2009 |
| WO | 2009/079321 A1 | 6/2009 |

OTHER PUBLICATIONS

U.S. Appl. No. 12/795,052, filed Jun. 7, 2010.
U.S. Appl. No. 12/795,076, filed Jun. 7, 2010.

(Continued)

*Primary Examiner* — Michael M Bernshteyn

(57) ABSTRACT

Disclosed is a multilayer film laminate comprising a layer consisting essentially of a fluorinated copolymer resin and a layer consisting essentially of an ethylene terpolymer. The ethylene terpolymer layer can be used as an encapsulant layer for solar cells and the multilayer laminate is useful as a component of photovoltaic modules. Methods for preparing photovoltaic modules are also included.

15 Claims, No Drawings

OTHER PUBLICATIONS

Pern et al., Adhesion Strength Study of Eva Encapsulants on Glass Substrates, NCPV and Solar Program Review Meeting Conference Paper, 2003, p. 942.

Chou et al., High Flexibility EMA made from High Pressure Tubular Process, 60$^{th}$ Annual Technical Conference—Society of Plastics Engineers, vol. 2, 2002, pp. 1832-1836.

United States Statutory Invention Registration, H130, Sep. 2, 1986.

Kirk-Othermer Encyclopedia of Chemical Technology, 5$_{th}$ Edition, vol. 18, 2006, pp. 316-329.

PCT International Search Report for International Application No. PCT/US2011/045159 dated Oct. 20, 2011.

* cited by examiner

MULTILAYER STRUCTURES CONTAINING A FLUORINATED COPOLYMER RESIN LAYER AND AN ETHYLENE TERPOLYMER LAYER

FIELD OF THE INVENTION

The invention is directed to multilayer film structures comprising a layer comprising a fluorinated copolymer resin and a layer of an ethylene terpolymer and methods for preparing the structure. The invention is further directed to methods for preparing photovoltaic modules that comprise the multilayer films.

BACKGROUND OF THE INVENTION

Photovoltaic (PV) modules (also known as solar modules) are used to produce electrical energy from sunlight, offering a more environmentally friendly alternative to traditional methods of electricity generation. Such modules are based on a variety of semiconductor cell systems that can absorb light and convert it into electrical energy. These systems are typically categorized into two types based on the light absorbing material used, i.e., bulk or wafer-based modules and thin film modules. Typically, individual cells are electrically connected in an array to form a module, and an array of modules can be connected together in a single installation to provide a desired amount of electricity.

When the light absorbing semiconductor material in each cell and the electrical components used to transfer the electrical energy produced by the cells are suitably protected from the environment, photovoltaic modules can last 25, 30, and even 40 or more years without significant degradation in performance. In a typical photovoltaic module construction, the solar cell layer is positioned between two encapsulant layers, which are further positioned between frontsheet and backsheet layers providing weather resistance, UV resistance, moisture barrier properties, low dielectric constant, and high breakdown voltage.

Fluoropolymer films are recognized as important components in photovoltaic modules due to their excellent strength, weather resistance, UV resistance, moisture barrier properties, low dielectric constant, and high breakdown voltage and can play a role in both wafer-based and thin film modules. For example, a fluoropolymer film, such as an ethylene-tetrafluoroethylene copolymer (ETFE) film, may be used as a frontsheet for a photovoltaic module instead of the more common glass layer. Challenges associated with using a fluoropolymer film as a frontsheet include providing the desired combination of barrier properties and transparency, as well as providing good adhesion to an adjacent encapsulant layer. For instance, higher transparency will improve solar module efficiency in converting sunlight into electricity, but achieving higher transparency typically requires the use of thinner fluoropolymer films, which reduces strength, weather resistance, UV resistance, and moisture barrier properties. Furthermore, the reduced barrier properties of thinner films can result in more rapid degradation of the encapsulant layer, further reducing the overall performance of the module. ETFE films have become the most widely used fluoropolymer materials for manufacture of photovoltaic (PV) module frontsheets due to the excellent adhesion of ETFE to ethylene vinyl acetate copolymers (EVA), the most commonly used material for the encapsulant layer, due to its low cost, high clarity, low modulus, low initial viscosity, low equilibrium moisture level, and good heat resistance.

EVA copolymers have been favored encapsulant materials because they are characterized by low melting temperatures, which allows them to readily flow around and seal the solar cell components. However, the low melting temperature properties of EVA copolymers generally necessitate subsequent crosslinking of the polymer to provide suitable thermal stability of the resulting photocells.

Moreover, the use of crosslinkable EVA as an encapsulant is not trouble-free. For example, the liberation of acetic acid from EVA can lead to corrosion and yellowing of the EVA encapsulant. Also, because peroxides are often incorporated in the EVA encapsulant as part of the crosslinking reaction, the shelf life of the EVA encapsulant is reduced and decomposition of the peroxide results in evolution of oxygen which may cause bubble formation. Finally, it is necessary that the EVA sheet be produced at a very low extrusion temperature to prevent premature crosslinking, that is, crosslinking prior to lamination to form the solar cell module.

Therefore, alternative materials that exhibit higher thermal dimensional stability without crosslinking are of interest for use in encapsulant layers.

In the past, encapsulant materials have been compounded with silane coupling agents, including aminosilanes, to improve adhesion to fluoropolymer layers. (See e.g. U.S. Pat. Nos. 6,963,120 and 6,762,508; U.S. Patent Application Publications 2009/0183773, 2009/0120489, 2009/0255571, 2008/0169023, 2008/0023063, 2008/0023064 and 2007/0267059; U.S. Provisional Patent Application Number 61/230,238; European Patent Application 1065731; French Patent 2539419 and Japanese Patent Applications 2000/186114, 2001/144313, 2004/031445, 2004/058583, 2006/032308 and 2006/190867). U.S. Pat. No. 6,753,087, discloses a multilayer structure including a fluoropolymer bonded to a substrate. The structure is prepared by heating a bonding composition including an amino-substituted organosilane to form a bond. U.S. Patent Application Publications 2008/0023063, 2008/0023064, 2008/0264471 and 2008/0264481 describe solar cells in which one or both surfaces of any of the solar cell laminate layers may be treated with a silane that incorporates an amine function. U.S. patent application Ser. No. 12/795,052, "Method for Preparing Transparent Multilayer Film Structures Having a Perfluorinated Copolymer Resin Layer", filed Jun. 7, 2010 and U.S. patent application Ser. No. 12/795,076, "Method for Preparing Multilayer Structures Containing a Perfluorinated Copolymer Resin Layer", filed Jun. 7, 2010 disclose the use of aminosilanes as surface-treatment agents or additives for ethylene copolymer films adhered to fluoropolymer films useful as PV module components.

U.S. Pat. No. 7,638,186 and European Patent Application Publication EP577985 disclose the use of tetrafluoroethylene-hexafluoropropylene copolymers, commonly referred to as FEP, as back sheet layers in photovoltaic modules. International Patent Application Publication WO2004/019421 discloses the use of FEP as a front sheet layer in photovoltaic modules.

There is a need for alternative encapsulant materials for use in photovoltaic modules that incorporate fluoropolymer films. Such materials would desirably exhibit a combination of good adhesion to fluoropolymer layers, particularly under adverse conditions, and high light transmittance, thereby enabling development of improved photovoltaic modules.

SUMMARY OF THE INVENTION

The present invention provides a transparent multilayer film laminate comprising:

A. a first film layer comprising a fluorinated copolymer resin composition wherein i) the fluorinated copolymer comprises copolymerized units of tetrafluoroethylene and at least one comonomer selected from the group consisting of ethylene, perfluorinated comonomers, and combinations thereof, and ii) at least one surface of the first film layer has been modified by a surface treatment;

B. a second film layer comprising a polymeric material comprising a terpolymer consisting essentially of copolymerized units of i) ethylene; ii) a first olefin of the formula of $CH_2=C(R^1)CO_2R^2$, wherein $R^1$ is hydrogen or an alkyl group having 1 to 8 carbon atoms and $R^2$ is an alkyl group having 1 to 8 carbon atoms; and iii) a second olefin of the formula $CH_2=C(R^3)D$, wherein $R^3$ is hydrogen or an alkyl group having 1 to 8 carbon atoms, and D is $-CO_2H$, $-CO_2R^4$, $-CO_2R^5-R^4$, $-R^5-R^4$, $-O-R^4$, or $-R^4$, wherein $R^4$ is a moiety containing an epoxy group and $R^5$ is an alkylene group having 1 to 8 carbon atoms;

wherein a surface of the second film layer is adhered to the modified surface of the first film layer and the multilayer film laminate is characterized by i) having an average peel strength between the first film layer and the second film layer of greater than 5 lbf/in, measured after exposing the multilayer film laminate to conditions of 85° C. and 85% relative humidity for 1000 hours.

The transparent multilayer film laminate described above can be prepared by a method comprising:

A. providing a first film layer comprising a fluorinated copolymer resin composition wherein i) the fluorinated copolymer comprises copolymerized units of tetrafluoroethylene and at least one comonomer selected from the group consisting of ethylene, perfluorinated comonomers, and combinations thereof, and ii) at least one surface of the first film layer has been modified by a surface treatment;

B. providing a second film layer comprising a polymeric material comprising a terpolymer consisting essentially of copolymerized units of i) ethylene; ii) a first olefin of the formula $CH_2=C(R^1)CO_2R^2$, wherein $R^1$ is hydrogen or an alkyl group having 1 to 8 carbon atoms and $R^2$ is an alkyl group having 1 to 8 carbon atoms; and iii) a second olefin of the formula $CH_2=C(R^3)D$, wherein $R^3$ is hydrogen or an alkyl group having 1 to 8 carbon atoms, and D is $-CO_2H$, $-CO_2R^4$, $-CO_2R^5-R^4$, $-R^5-R^4-$, $-O-R^4$, or $-R^4$, wherein $R^4$ is a moiety containing an epoxy group and $R^5$ is an alkylene group having 1 to 8 carbon atoms;

C. contacting a surface of the second film layer with the modified surface of the first film layer; and D. adhering the first film layer to the second film layer by the application of heat and optionally pressure or vacuum.

The transparent multilayer film may be used as an integrated frontsheet for preparation of a photovoltaic module.

Accordingly, the invention is further directed to a method for preparing a photovoltaic module, the method comprising the steps:

A. providing a solar cell layer;
B. providing a multilayer film laminate as described above that is larger in area than the solar cell layer;
C. overlaying the solar cell layer with the multilayer film laminate such that
  1. a surface of the second film layer of the multilayer film laminate contacts the solar cell layer;
  2. a portion of the second film layer of the multilayer film laminate extends beyond the perimeter of the solar cell layer; and
  3. the portion of the second film layer of the multilayer film laminate that extends beyond the perimeter of the solar cell layer contacts another layer that is an encapsulant layer; and
D. adhering the second film layer of the multilayer film laminate to the encapsulant layer by the application of heat and optionally pressure or vacuum to provide a photovoltaic module.

The invention also provides a method for preparing a photovoltaic module in a single lamination operation. That is, the invention provides a method for preparing a photovoltaic module comprising a multilayer laminate, the method comprising the steps:

A. providing a solar cell layer;
B. providing a first film layer comprising a fluorinated copolymer resin wherein i) the fluorinated copolymer resin comprises copolymerized units of tetrafluoroethylene and a comonomer selected from the group consisting of ethylene, perfluorinated comonomers and combinations thereof and ii) at least one surface of the first film layer has been modified by a surface treatment;
C. providing a second film layer that is larger in area than the solar cell layer wherein the second film layer comprises a polymeric material consisting essentially of a terpolymer consisting essentially of copolymerized units of i) ethylene; ii) a first olefin of the formula $CH_2=C(R^1)CO_2R^2$, wherein $R^1$ is hydrogen or an alkyl group having 1 to 8 carbon atoms and $R^2$ is an alkyl group having 1 to 8 carbon atoms; and iii) a second olefin of the formula of $CH_2=C(R^3)D$, wherein $R^3$ is hydrogen or an alkyl group having 1 to 8 carbon atoms, and D is $-CO_2H$, $-CO_2R^4$, $-CO_2R^5-R^5$, $-R^5-R^4$, $-O-R^4$, or $-R^4$, wherein $R^4$ is a moiety containing an epoxy group and $R^5$ is an alkylene group with 1 to 8 carbon atoms;
D. contacting a modified surface of the first film layer with a first surface of the second film layer;
E. contacting the solar cell layer with the second film layer such that
  1. the second surface of the second film layer contacts the solar cell layer;
  2. a portion of the second film layer extends beyond the perimeter of the solar cell layer; and
  3. the portion of the second film layer that extends beyond the perimeter of the solar cell layer contacts another layer that is an encapsulant layer; and
F. adhering the second film layer to the first film layer and to the encapsulant layer by the application of heat and optionally pressure or vacuum to provide a photovoltaic module;

wherein the photovoltaic module is characterized by having an average peel strength between the first film layer and the second film layer of greater than 5 lbf/in, measured after exposing the photovoltaic module to conditions of 85 ° C. and 85% relative humidity for 1000 hours.

DETAILED DESCRIPTION

The following definitions are used herein to further define and describe the disclosure.

As used herein, the terms "comprising," "comprises," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the terms "a" and "an" include the concepts of "at least one" and "one or more than one".

Unless stated otherwise, all percentages, parts, ratios, etc., are by weight.

When the term "about" is used in describing a value or an end-point of a range, the disclosure should be understood to include the specific value or end-point referred to or stated.

The terms "epoxy group", "ethylene oxide group" and "oxirane ring" are synonymous and used interchangeably herein to refer to a substituted or unsubstituted group having the formula —CROCR$_2$, wherein the oxygen atom is bound to both carbons and the carbons are bound to each other. When the R groups are hydrogen atoms, the ethylene oxide group is unsubstituted. The ethylene oxide group may be singly or multiply substituted with groups independently selected from hydrogen and other atoms or groups. Stated alternatively, one, two or three of the R groups may be other than hydrogen atoms.

The term "alkyl group", as used herein alone or in combined form, such as, for example, "alkoxy group", refers to saturated hydrocarbon groups that have from 1 to 8 carbon atoms and that may be branched or unbranched. "Alkylene" is a saturated hydrocarbon having two substituents, such as methylene, ethylene or propylene.

In this application, the terms "sheet", "layer" and "film" are used in their broad sense interchangeably. A "frontsheet" is a sheet, layer or film positioned as the outermost layer on the side of a photovoltaic module that faces a light source and may also be described as an incident layer. Because of its location, it is generally desirable that the frontsheet has high transparency to the desired incident light. It is also desirable that the frontsheet has high moisture barrier properties to prevent entry of moisture into the photovoltaic module, which can degrade the components and/or reduce the electrical efficiency of the photovoltaic module. A "backsheet" is a sheet, layer or film on the side of a photovoltaic module that faces away from a light source, and is often opaque. In some instances, it may be desirable to receive light from both sides of a device (e.g. a bifacial device), in which case a module may have transparent layers on both sides of the device.

"Encapsulant" layers are used to encase the fragile voltage-generating solar cell layer to protect it from damage and hold it in place in the photovoltaic module and are normally positioned between the solar cell layer and the incident layer and the backing layer. Suitable polymer materials for these encapsulant layers typically possess a combination of characteristics such as high transparency, high impact resistance, high penetration resistance, high moisture resistance, good ultraviolet (UV) light resistance, good long term thermal stability, adequate adhesion strength to frontsheets, backsheets, other rigid polymeric sheets and cell surfaces, and good long term weatherability.

An "integrated frontsheet" is a sheet, layer or film that combines an incident layer and an encapsulant layer. An "integrated backsheet" is a sheet, layer or film that combines a backing layer and an encapsulant layer.

A "laminate" is a structure that can be constructed by uniting two or more layers of materials together, optionally using pressure.

The term "copolymer" is used herein to refer to polymers containing copolymerized units of two different monomers (i.e. a dipolymer), or more than two different monomers (e.g. a terpolymer, tetrapolymer or higher order polymer). A "terpolymer" consists essentially of copolymerized units of three different monomers.

The terms "transparency" and "transparent" as used herein refer to the amount of light that can pass through or be transmitted through a material, compared to the light transmitted through air. "Light transmission level" as used herein is the percentage of light transmitted through a material compared to that transmitted through air.

Increased light transmission for front sheet constructions is desirable for increasing the amount of incident sunlight that reaches the solar cell layer. This enables improved efficiency of photovoltaic modules by allowing more solar energy to be available for conversion to electrical energy by the solar cells.

Organosilane coupling agents have been used in the past to improve adhesion between compositions used as encapsulant materials and various materials used in incident layers of photovoltaic modules. For example, ethylene/vinyl acetate (EVA) copolymer compositions used in photovoltaic module encapsulant layers generally include an organosilane coupling agent such as y-methacryloxypropyltrimethoxysilane to facilitate bonding to other materials. See "Adhesion Strength Study of EVA Encapsulants on Glass Substrates" F. J. Pern and S. H. Glick, NCPV and Solar Program Review Meeting 2003 NREL/CD-520-33586, Page 942.

It has now been found that certain ethylene ester terpolymers as described herein provide compositions that exhibit adhesion to fluorinated copolymer resin films that is significantly enhanced compared to that of similar compositions comprising other polymeric materials. The enhanced adhesion is attained without the necessity of modification of the terpolymer with silane coupling agents. Significantly enhanced adhesion is observed after exposure to damp heat (85° C./85% relative humidity) for periods of 1000 hours or more as described in the test methods below.

In addition, the terpolymers have the advantage of higher melting points than EVA compositions previously used in photovoltaic modules.

It has further been found that the particular ethylene terpolymers described herein can be used to prepare a transparent laminate having unusually good adhesion properties. The laminate comprises a film layer that consists essentially of a fluorinated copolymer resin directly adhered to a second film layer that consists essentially of an ethylene ester terpolymer. The laminate of fluorinated copolymer resin film and adhered ethylene ester terpolymer film has substantially enhanced interlayer adhesion properties compared to similar laminates that do not comprise an ethylene ester terpolymer film layer. The compositions provide a weatherable multilayer film laminate that has an unusual combination of high adhesivity and excellent transparency, which is particularly suited for use in photovoltaic modules. As used herein, a weatherable multilayer film is a film in which the individual layers are well adhered to each other, such that the peel strength between the layers is greater than 5 lbf/in after exposure to 1000 hours of damp heat (85° C./85% relative humidity) as described in the test methods below.

The first layer of the multilayer film laminate of the invention comprises a fluorinated copolymer resin. Suitable fluorinated copolymer resin components of the first layer are tetrafluoroethylene (TFE) copolymers. That is, the polymer component will contain copolymerized units of tetrafluoroethylene and additional copolymerized monomers. These fluoropolymers are used to form transparent films having excellent moisture barrier properties and transparency.

The basic and novel characteristics of the multilayer laminate include transparency and interlayer adhesivity, more fully described herein. In addition, if non-fluorinated monomers are present as copolymerized units, the amount of such monomers should be limited so that the copolymer retains desirable fluoropolymer properties, i.e., weather resistance, solvent resistance and barrier properties. In certain embodiments, the fluorinated copolymer resin is a copolymer of fluoroolefins and fluorinated vinyl ethers. Atoms other than fluorine and carbon may be present in the copolymer end groups, i.e. the groups that terminate the polymer chains.

The fluoropolymers, including perfluoropolymers, used herein are those that are melt-fabricable, i.e. they are sufficiently flowable in the molten state that they can be fabricated by melt processing such as extrusion, to produce products having sufficient strength so as to be useful. The melt flow rate (MFR) of the fluoropolymers is preferably at least about 5 g/10 min, more preferably at least about 10 g/10 min, still more preferably at least about 15 g/10 min, even more preferably at least about 20 g/10 min, and most preferably, at least 26 g/10 min, as measured according to ASTM D 1238 at the temperature and load which are standard for the resin (see for example ASTM D 2116-91a and ASTM D 3307-93).

Fluoropolymers of note include ethylene-tetrafluoroethylene copolymers (ETFE). Commercial ETFE copolymers are typically ethylene-tetrafluoroethylene copolymers modified by incorporation of a small amount of an additional termonomer. Modified ETFE comprises from about 35 to about 65 mole percent ethylene, about 35 to about 65 mole percent tetrafluoroethylene, and a small amount of a copolymerizable vinyl monomer which is free of telogenic activity and which incorporates into the copolymer a side chain containing at least two carbon atoms, with the side chain having only single bonds between elements or comprising an aromatic ring. By small amount is meant up to about 5 mole percent of the ETFE copolymer. Preferably the ratio of ethylene to TFE in the copolymer is about 40:60 to 60:40 or about 50:50. The incorporation of a small amount of termonomer provides significantly improved tensile strength, stiffness, flex life, impact strength, abrasion resistance and cut-through resistance over the unmodified copolymer.

Such modified ETFE copolymers are taught in U.S. Pat. No. 3,624,250 and specifications for the copolymer and test methods for the as-produced copolymer are found in ASTM method D3159.

Of note are ETFE copolymers that incorporate perfluorobutylethylene (3,3,4,4,5,5,6,6,6-nonafluorohexa-1-ene or PFBE) as a termonomer, including copolymers that contain 70 to 85 weight % TFE, 15 to 20 weight % ethylene and 2 to 5 weight % PFBE. Examples of such copolymers are those that contain 76.5 to 80.1 weight % TFE, 17.8 to 19.6 weight % ethylene, and 2.1 to 3.9 weight % PFBE.

ETFE copolymers are described in the Kirk-Othmer Encyclopedia of Chemical Technology (5th edition), 2006, volume 18, pages 316-329.

Alternatives to ETFE films that exhibit higher transparency and/or better barrier properties are desirable, particularly for use in flexible solar cell modules where the use of rigid glass is not feasible. One alternative is a film made from a perfluorinated copolymer resin such as tetrafluoroethylene-hexafluoropropylene copolymer (FEP). However, adhesion of perfluorinated copolymers such as FEP to common encapsulant materials can be significantly poorer than adhesion of ETFE to such materials. The ethylene ester terpolymers described herein provide excellent adhesion to FEP, even without modification by organosilanes.

The fluoropolymers used in the laminates and methods described herein include perfluoropolymers. As indicated by the prefix "per", the monovalent atoms bonded to the carbon atoms making up the polymer chain are all fluorine atoms.

If nonfluorinated monomers are used as comonomers, the amount that is copolymerized should be limited so that the copolymer retains the desirable properties of the perfluoropolymer, i.e., weather resistance, solvent resistance, barrier properties, etc. In one embodiment, fluorinated comonomers include fluoroolefins and fluorinated vinyl ethers. Other atoms may be present in the polymer end groups, i.e. the groups that terminate the polymer chain.

Examples of perfluoropolymers that can be used include copolymers of tetrafluoroethylene (TFE) with one or more perfluorinated polymerizable comonomers, including a perfluoroolefin having 3 to 8 carbon atoms, such as hexafluoropropylene (HFP), and/or perfluoro(alkyl vinyl ether) (PAVE) in which the linear or branched alkyl group contains 1 to 5 carbon atoms. Preferred PAVE monomers are those in which the alkyl group contains 1, 2, 3 or 4 carbon atoms, respectively known as perfluoro(methyl vinyl ether) (PMVE), perfluoro(ethyl vinyl ether) (PEVE), perfluoro(propyl vinyl ether) (PPVE), and perfluoro(butyl vinyl ether) (PBVE). The copolymer can be made using several PAVE monomers, such as the TFE/perfluoro(methyl vinyl ether)/perfluoro(propyl vinyl ether) copolymer, sometimes called MFA by the manufacturer. The TFE/PAVE copolymers are most commonly referred to as PFA. They typically have at least about 1 weight % PAVE, including when the PAVE is PPVE or PEVE, and will typically contain about 1 to 15 weight % PAVE. When PAVE includes PMVE, the copolymer contains about 0.5 to 13 weight % of perfluoro(methyl vinyl ether) and about 0.5 to 3 weight % of PPVE, the remainder, which brings the total to 100 weight %, being TFE.

Tetrafluorethylene-hexafluoropropylene copolymers are preferred perfluoropolymers. These copolymers are commonly referred to as fluorinated ethylene propylene (FEP) polymers. The term "FEP copolymers" refers to copolymerized comonomers of tetrafluoroethylene (TFE) and hexafluoropropylene (HFP), optionally with any number of other copolymerized monomer units. The FEP copolymers may thus be dipolymers, terpolymers, tetrapolymers, and higher order copolymers.

In these copolymers, the HFP content is typically about 6-17 weight %, preferably 9-17 weight % (calculated from HFPI times 3.2). HFPI (HFP Index) is the ratio of infrared radiation (IR) absorbances at specified IR wavelengths as disclosed in U.S. Statutory Invention Registration H130. Preferably, the TFE/HFP copolymer includes a small amount of additional comonomer to enhance certain physical properties. The FEP copolymer can be TFE/HFP/perfluoro(alkyl vinyl ether) (PAVE), wherein the alkyl group contains 1 to 4 carbon atoms such as PEVE or PPVE. A preferred TFE/HFP copolymer is TFE/HFP/PAVE such as PEVE or PPVE, wherein the HFP content is about 6 to 17 weight %, preferably 9 to 17 weight %, and the PAVE content, preferably PEVE, is about 0.2 to 3 weight %, the remainder being TFE, thereby bringing the total weight percentage to 100 weight % of the copolymer.

Examples of useful FEP compositions are those disclosed in U.S. Pat. Nos. 4,029,868; 5,677,404; and U.S. Pat. No. 6,541,588; U.S. Patent Application Publication 2007/292685 and in US Statutory Invention Registration H130. The FEP may be partially crystalline. That is, it is not an elastomer. By partially crystalline is meant that the polymers have some crystallinity and are characterized by a detectable melting point measured according to ASTM D 3418, and a melting endotherm of at least about 3 J/g.

Of note are terpolymers containing copolymerized units of HFP (about 6 to 10 weight %), less than 2 weight % of perfluoroethylvinylether PEVE (about 1.5 to 2 weight %), with the remainder of the copolymerized units being TFE units. For example, such a copolymer may contain 7.2 to 8.1 weight % HFP, 1.5 to 1.8 weight % PEVE and 90.1 to 91.3 weight % TFE, with a nominal melt flow rate (MFR) of 6 to 8 μm/10 min as defined in ASTM D 2116 and a melting point of 260° C. to 270° C.

The first film layer of the multilayer film laminate of the invention comprises the above-described fluorinated copolymer resin. It may also comprise other components that do not adversely affect transparency and adhesion of the copolymer resin. For example, additives such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers may be present in the first layer. Generally, such additives are present in amounts of up to 20 weight percent of the first film layer composition, based on the weight of the total composition of the first layer. In many embodiments, no more than 10 weight percent additives are present. In other embodiments less than 2 weight percent additives are present.

Transparent fluorinated copolymer film layers suitable for use in the film laminates of the invention may be formed by any technique known to those skilled in the art. For example, the films may be extrusion cast and optionally stretched and heat stabilized. Desirably, perfluorinated copolymer resin films used in the invention are oriented to provide improved properties, such as improved toughness and tensile strength.

The transparent fluorinated copolymer resin film can have a thickness in the range of about 25 to 200 microns, or about 50 to 150 microns, or about 50 to 125 microns and a transmission of greater than about 90%, or greater than about 94%, or greater than about 97% in the visible region of the electromagnetic spectrum, where the visible region of the electromagnetic spectrum is defined as from 380 to 780 nm. High transparency may also be observed in regions of the electromagnetic spectrum beyond the visible region such as between 350 to 800 nm or higher.

The transparent fluorinated copolymer resin film of the first film layer is subjected to a surface treatment prior to lamination to the second film layer. This surface treatment modifies the surface of the film and may take any form known in the art, including flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, chemical treatments, chromic acid treatments, hot air treatments, ozone treatments, ultraviolet light treatments, sand blast treatments, solvent treatments, and combinations of two or more thereof. A notable surface treatment is corona treatment (see, e.g., U.S. Pat. Nos. 3,030,290; 3,676,181; 6,726,979 and 6,972,068). Corona treatment can include use of reactive hydrocarbon vapors such as ketones, e.g., acetone, alcohols, p-chlorostyrene, acrylonitrile, propylene diamine, anhydrous ammonia, styrene sulfonic acid, carbon tetrachloride, tetraethylene pentamine, cyclohexylamine, tetraisopropyl titanate, decylamine, tetrahydrofuran, diethylene triamine, tertiary-butylamine, ethylene diamine, toluene-2,4-diisocyanate, glycidyl methacrylate, triethylene tetramine, hexane, triethylamine, methyl alcohol, vinyl acetate, methylisopropyl amine, vinyl butyl ether, methyl methacrylate, 2-vinyl pyrrolidone, methyl vinyl ketone, xylene or mixtures thereof.

When the fluorinated copolymer resin film is surface-treated, the resulting chemical or physical modification of the fluorinated copolymer resin or of the film surface provides a modified first film layer surface. The modified fluorinated copolymer surface makes it more amenable to further treatment, such as improved adhesion to other materials. Without being tied to any specific mechanism or theory, the surface treatment may create polar functionalization and/or increased surface energy of the surface.

FEP films that have been surface-treated as described above, such as the grade designated PV3151 commercially available from E. I. du Pont de Nemours and Company ("DuPont"), are suitable for use in this invention.

In addition to corona treatment, the fluorinated copolymer resin film may also be surface-treated with an organosilane coupling agent prior to contacting the surface of the second layer. An organosilane coupling agent is a silane coupling agent that contains at least one carbon-silicon bond. The silicon atom may be bonded to three hydrolysable groups, such as methoxy-, ethoxy-, chloro-, or acetoxy-, and an organoreactive group. Without being bound by any theory, the silane may bond to reactive moieties on the surface of the fluoropolymer via the hydrolysable groups and then may either react with or physically entangle with a polymer or other organic material via the organoreactive group.

Organosilane coupling agents can contain a wide variety of organoreactive groups. Some examples of different types of organoreactive groups can include amino, benzylamino, methacrylate, vinylbenzylamino, epoxy, chloropropyl, melamine, vinyl, ureido, mercapto, disulfide, and tetrasulfido groups. An organosilane coupling agent can include a single type of organoreactive group, a mixture of two or more groups of the same type, a mixture of two or more different types of groups, or a combination thereof. An example of a silane coupling agent is [3-(methacryloyloxy)propyl]trimethoxysilane (MAOPTMS or 3-(trimethoxysilyl)propyl methacrylate).

Preferably, the organosilane that is used to treat the fluorinated copolymer resin film is an aminosilane coupling agent. Examples of aminosilanes that are useful include 3-aminopropyltrimethoxysilane (APTMS), 3-aminopropyltriethoxysilane (APTES), N,N'-bis[(3-trimethoxysilyl)propyl]ethylenediamine (dipodalAP), N-(2-aminoethyl)-3-aminopropyltrimethoxysilane (AEAPTMS) and N-2-(vinylbenzylamino)-ethyl-aminopropyltrimethoxysilane (SMAEAPTMS), notably APTMS, APTES and AEAPTMS.

The organosilane coupling agent, such as an aminosilane, may be applied to the surface of the fluorinated copolymer resin film layer, preferably a surface that has been treated as described above, using any known technique including liquid phase (e.g., dip coating, spray coating, etc.) and gas phase (e.g., vapor deposition) techniques. Preferably, the aminosilane coupling agent may be applied as a liquid solution, generally a solution wherein the concentration of aminosilane is from 0.05 to 1% by weight. The aminosilane may be dissolved in a solution including a polar organic solvent and applied to a film using a dip coating technique, followed by drying to remove the solvent. The drying may occur at an elevated temperature, sufficient to drive off the liquid solvent. The polar organic solvent may be a low molecular weight alcohol, such as those having 8 or fewer, preferably 4 or fewer, carbon atoms, (e.g., methanol, ethanol, propanol, or isopropanol). The solution may include a mixture of a polar organic solvent and water. For example, a 0.1 weight % aminosilane solution may be applied using a solution of 95% ethanol in water, and then dried at a temperature of 100° C. A range of solution compositions and drying temperatures can be used, and the composition and drying temperature will depend on the particular aminosilane used in combination with the solvent chosen, as well as the surface characteristics of the fluorinated copolymer resin film layer and the second ethylene terpolymer film layer to which it will be adhered.

One can also appreciate that the aminosilane coupling agent may be applied to the surface of one side of the fluorinated copolymer resin film, or it may be applied to the surfaces of both sides of the fluorinated copolymer resin film.

Silane surface treatment of the fluorinated copolymer resin film layer may be used to enhance adhesion of the fluorinated copolymer resin to the second ethylene terpolymer film layer. However, the terpolymers described herein for use in the second film layer have good adhesion to fluorinated copolymer resin film layers without silane surface treatment of the fluorinated copolymer resin film layer.

The second film layer of the laminates of the invention consists essentially of an ethylene ester terpolymer. The second film layer is substantially free of polymers other than the ethylene ester terpolymer. By substantially free is meant that less than 1 weight %, preferably less than 0.5 weight % of other polymers are present in the second film layer composition. Because the transparent multilayer film laminate is suitable for use as an integrated front sheet for a photovoltaic module, the second film layer is preferably able to function as an encapsulant layer. Alternatively, the second film layer may be used as an adhesive layer, providing excellent adhesion to both fluorinated copolymer resins and to other materials that can be used as encapsulant materials in photovoltaic modules.

The ethylene ester terpolymer contains copolymerized units of i) ethylene; ii) a first olefin that is an α,β-ethylenically unsaturated carboxylic acid ester of the formula $CH_2=C(R^1)CO_2R^2$, wherein $R^1$ is hydrogen or an alkyl group having 1 to 8 carbon atoms and $R^2$ is an alkyl group having 1 to 8 carbon atoms; and iii) a second olefin of the formula $CH_2=C(R^3)D$, wherein $R^3$ is hydrogen or an alkyl group having 1 to 8 carbon atoms, and D is $-CO_2H$, $-CO_2R^4$, $-CO_2R^5-R^4$, $-R^5-R^4$, $-O-R^4$, or $-R^4$, wherein $R^4$ is a moiety containing an epoxy group and $R^5$ represents an alkylene group having 1 to 8 carbon atoms. Thus, the second olefin is either an α,β-ethylenically unsaturated carboxylic acid or an olefin that contains a glycidyl group.

Examples of α,β-ethylenically unsaturated carboxylic acid esters that are suitable first olefin comonomers include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, 2-ethylhexyl acrylates, and 2-ethylhexyl methacrylates. Preferably, the esters of unsaturated carboxylic acids are alkyl acrylates or alkyl methacrylates.

More preferably, the ester terpolymer comprises copolymerized units of an alkyl acrylate. The alkyl moiety of the alkyl acrylate may contain 1 to 8 or 1 to 4 carbon atoms, such as methyl, ethyl, and branched or unbranched propyl, butyl, pentyl, and hexyl groups. Exemplary alkyl acrylates include, but are not limited to, methyl acrylate, ethyl acrylate, isobutyl acrylate, and n-butyl acrylate. The polarity of the alkyl acrylate comonomer may be manipulated by changing the relative amount and identity of the alkyl group present in the comonomer. Similarly, a $C_1-C_6$ alkyl methacrylate comonomer may be used as a comonomer. Such comonomers include methyl methacrylate, ethyl methacrylate, i-butyl methacrylate, and n-butyl methacrylate. These terpolymers may contain 15 to 40, preferably 20 to 35, weight % of alkyl acrylate or alkyl methacrylate. Notable terpolymers comprise copolymerized units of n-butyl acrylate, for example 20 to 30 weight % of n-butyl acrylate.

The second olefin, i.e. the third comonomer of the ethylene ester terpolymer, may be an α,β-unsaturated carboxylic acid of the formula $CH_2=C(R^3)COOH$ (that is, wherein D in the formula above representing the second olefin is $-CO_2H$), wherein $R^3$ represents hydrogen or an alkyl group with 1 to 8 carbon atoms. Suitable α,β-ethylenically unsaturated carboxylic acid comonomers include, but are not limited to, acrylic acids, methacrylic acids, and combinations thereof. Preferably, the α,β-ethylenically unsaturated carboxylic acid is selected from the group consisting of acrylic acids, methacrylic acids, and combinations of two or more thereof. The terpolymer may contain about 5 to about 30 weight %, or about 5 to about 20 weight %, or about 5 to about 15 weight %, based on the total weight of the terpolymer, of copolymerized residues of the α,β-unsaturated carboxylic acid.

The remainder of the ethylene ester acid terpolymer comprises copolymerized residues of ethylene. Copolymerization of ethylene, the first olefin and the second olefin in this embodiment of the terpolymer provides an ethylene ester acid terpolymer. Methods of preparing ethylene ester acid terpolymers are known. For example, the terpolymers may be prepared in continuous polymerizers by use of "co-solvent technology" as described in U.S. Pat. No. 5,028,674. The ethylene ester acid terpolymer is not an ionomer (as described below). In a particular example, it is a copolymer of ethylene/n-butyl acrylate/acrylic acid.

Preferably, the first olefin comonomer, i.e. the monomer of the formula $CH_2=C(R^1)CO_2R^2$, is butyl acrylate and D (in the formula above of the second olefin comonomer) is $-CO_2H$.

The ethylene ester acid terpolymer may have a melt flow rate or melt index (MFR or MI) of about 5 to about 500 g/10 minute, or about 5 to about 200 g/10 min, or about 5 to about 100 g/10 min, as determined in accordance with ASTM D 1238 at 190° C. and under a weight of 2.16 kg.

Ethylene ester acid terpolymers are commercially available from DuPont under the trademark Nucrel®.

Alternatively, the second olefin comonomer in the terpolymer may be an olefin containing an epoxy group. That is, the olefin may be a compound of the formula $CH_2=C(R^3)D$, wherein $R^3$ is hydrogen or an alkyl group; D is $-CO_2R^4$, $-CO_2R^5-R^4$, $-R^5-R^4$, $-O-R^4$, or $-R^4$; wherein $R^5$ is an alkylene group and $R^4$ is a moiety containing an epoxy group, such as a glycidyl group, a 1,2-cyclohexenyl oxide group, or a 1,2-epoxy group. A notable comonomer of the structure $CH_2=C(R^3)D$ is glycidyl methacrylate. The terpolymer may contain about 3 to about 15 weight %, or about 3 to about 10 weight %, or about 4 to about 7 weight %, based on the total weight of the terpolymer, of copolymerized residues of the olefin of the formula $CH_2=C(R^3)D$. As described above, the terpolymer also contains 15 to 40, preferably 20 to 35, weight % of copolymerized units of an alkyl acrylate or alkyl methacrylate comonomer, the remainder being copolymerized units of ethylene.

Preferably, the first olefin comonomer $CH_2=C(R^1)CO_2R^2$ is butyl acrylate and D in the formula $CH_2=C(R^3)D$ is $-CO_2R^4$, $-CO_2R^5-R^4$, $-R^5-R^4$, $-O-R^4$, or $-R^4$.

In one particular example, the terpolymer is the copolymer ethylene/n-butyl acrylate/glycidyl methacrylate. Such terpolymers are commercially available from DuPont under the trademark Elvaloy®.

The epoxy-containing ethylene terpolymers described above may have melt flow rates of about 5 to about 500 or about 5 to about 100 g/10 min, as determined in accordance with ASTM D 1238 at 190° C. and under a weight of 2.16 kg.

The composition used in the second film layer may further contain one or more non-polymeric additives, such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers.

The multilayer film laminates of the invention may be prepared by contacting the first and second film layers and adhering the two layers by the application of heat and optionally pressure. The composition of the second layer of the multilayer laminate may be adhered to the modified surface of the fluorinated copolymer resin first film as a coating (via extrusion coating or other appropriate application methods), as a film or membrane, or as a layer of a laminate.

Extrusion coating involves melting the terpolymer composition in an extruder and passing it through a slit die to form a molten polymer curtain which drops onto a moving film substrate comprising the first layer fluoropolymer composition. The terpolymer coating is adhered by being pressed onto the substrate and quenched by a quench drum.

Alternatively, a film made of the second film layer composition may be adhered to a film made of the first layer fluorinated copolymer resin composition. A surface of the first fluorinated copolymer resin layer that has been surface-modified as described above is contacted with a surface of a film of the second film layer terpolymer composition. Contact is made in such a manner that the fluorinated copolymer resin layer and the second film layer are arranged in overlying fashion. The resulting multilayer overlay (prior to adhesion by heat and optional pressure or vacuum) may be used in a subsequent lamination step to provide a multilayer film laminate (after the layers are adhered by heat and optional pressure or vacuum).

The first fluorinated resin copolymer film layer and the second ethylene ester terpolymer film layer are adhered by the application of heat and optionally pressure or vacuum to form the transparent multilayer film laminates described herein. Sufficient heat is applied to the multilayer film structure to reach a temperature above the softening temperature of the second film layer so that it softens and adheres to the first fluorinated copolymer resin layer. In addition, one or more other layers may be in contact with one or more of the first and/or second film layers. No layers intervene between the first and second layers. Depending on the equipment used, lamination conditions, number of other layers present, and the like, it may be necessary to maintain the temperature at 10 to 30° C. higher than the softening temperature of the second film layer for a period of one to 10 minutes to achieve adhesion. Optionally, pressure or vacuum can be applied to the multilayer film structure during heating to ensure good contact between the layers. This provides a multilayer film laminate that exhibits excellent adhesion properties.

In some embodiments, it may be desirable to effect adhesion by contacting the second film layer with the first fluorinated copolymer resin film layer to form a multilayer film overlay, applying heat and passing the multilayer film structure through a nip. For example, the multilayer film structure may be heated in an oven at about 90° C. to about 130° C., or about 90° C. to about 120° C., for a period of time sufficient to soften the second layer (e.g. about 1 to about 5 minutes), and thereafter, the heated multilayer film structure is passed through a set of nip rolls so that the air in the void spaces between the individual layers may be squeezed out, and the edge of the multilayer film structure sealed. This forms a multilayer film laminate. The multilayer film laminate can be laid up with additional layers such as solar cell layers, backing sheets, etc. to provide a multilayer structure, which may also be referred to as a pre-press. The multilayer pre-press may then be placed in an air autoclave where the temperature is raised to about 120° C. to about 160° C., or about 135° C. to about 160° C., at a pressure of about 100 to about 300 psi (about 6.9 to about 20.7 bar), or about 200 psi (13.8 bar). These conditions may be maintained for about 5 to 10 minutes. After cooling, the excess air pressure is vented and the laminated product, a photovoltaic module, is removed from the autoclave.

The multilayer film laminates described herein may also be produced through non-autoclave processes. Such non-autoclave processes are disclosed, for example, in U.S. Pat. Nos. 3,234,062; 3,852,136; 4,341,576; 4,385,951; 4,398,979; 5,536,347; 5,853,516; 6,342,116 and 5,415,909; US20040182493, EP1235683 B1, WO9101880 and WO03057478. Generally, the non-autoclave processes include heating the pre-lamination assembly and the application of vacuum, pressure or both. For example, the assembly may be successively passed through heating ovens and nip rolls.

A vacuum laminator may be used to adhere the fluorinated copolymer resin first film layer to the second film layer to provide a multilayer film laminate. The laminator comprises a platen base, on which the layers are placed in overlaying fashion for lamination. The laminator also comprises an enclosure that covers and completely surrounds the platen base. The region enclosed by the platen and enclosure may be evacuated. The laminator also comprises a flexible bladder within the enclosure attached to the top inner surface of the enclosure, which may be inflated to a pressure greater than the pressure in the evacuated region. For example, the pressure above the bladder may be atmospheric and the laminate may be held under vacuum beneath the bladder to remove air. When the bladder is inflated, the flexible surface of the bladder is pushed from the top of the enclosure toward the platen and applies a surface pressure to the multilayer overlay to ensure good thermal contact between the overlay and the platen. For lamination of the multilayer film structure, the laminator is preheated to a temperature above the softening temperature of the second film layer and held at that temperature throughout the lamination process.

Generally, when a vacuum laminator is used, one surface of the fluorinated copolymer resin first film is placed in contact with the surface of the second film layer such that the second film layer is positioned between the platen and the first film layer. Other layers may be placed between the second film layer and the platen for adhesion to the second film layer. Heat-resistant sheets may be placed under the second film layer to retard heat flow and allow deaeration and devolatilization of the sample. Release sheets may be placed under the second film layer and/over the first film layer to prevent the layers from adhering to parts of the laminator. The multilayer film structure is placed on the platen and the enclosure of the laminator is lowered into place and sealed. Next, the region surrounding the multilayer film structure between the platen and enclosure of the laminator is evacuated (e.g. to a pressure of 1 mbar) to help further prevent the formation of voids, defects, and air pockets. Next, the rubber bladder is inflated (e.g. to a pressure of 999 mbar) so that it presses against the multilayer film structure and ensures good thermal contact with the platen. Pressure and temperature are maintained for a sufficient period of time (for 1 to 10 minutes) to soften the second film layer and adhere it to the fluorinated copolymer resin first film layer and, if present, any additional layer contacting the surface of the second film layer opposite the fluorinated copolymer resin first film layer.

When the heating step is complete, the bladder is depressurized to 0 mbar so that it may be removed from contact with the multilayer film laminate, the enclosure is vented to atmospheric pressure and the enclosure is unsealed and opened. The multilayer film laminate is removed from the platen and allowed to cool to room temperature.

With appropriate modifications, the lamination procedure can also be used to prepare photovoltaic modules including encapsulant layers, solar cell layers and/or backing layers as described below. The lamination methodology described herein is by no means the only possible way to carry out such laminations. For example, more advanced laminators have retractable pins that hold the multilayer laminate structure above the heat source until the desired time to effect contact and heating. This would obviate the need for heat resistant layers in most cases.

The weatherable multilayer film laminate may be used as an integrated frontsheet for a photovoltaic module that provides all the properties necessary to protect the electrical components of a photovoltaic module provided by separate incident and encapsulant layers and can be attached directly to the solar cell layer of the module. The transparent multilayer film laminate prepared herein may be used as an integrated frontsheet wherein the fluorinated copolymer resin film layer functions as the incident layer and the second film layer functions as an encapsulant layer.

Accordingly, the invention is directed to a method for forming a photovoltaic module that comprises the above-described method for preparing a transparent multilayer film laminate and also further comprises a step of overlaying a solar cell layer with the transparent multilayer film laminate prepared by the process of the invention. Photovoltaic modules, the solar cell layer, encapsulant layer and the additional layer or layers used in these methods are described in greater detail below.

In one embodiment a solar cell layer is contacted with the transparent multilayer film laminate in a manner such that the surface of the second film layer that is opposite that which contacts the first fluorinated copolymer resin film layer will contact the solar cell layer. In this embodiment, the area of the multilayer film laminate is larger than the area of the solar cell layer. Additionally, in this embodiment, those portions of the transparent multilayer film laminate that extend beyond the perimeter of the solar cell layer are positioned so as to contact an encapsulant layer that may be formed of the same or different material as the second film layer of the transparent multilayer film laminate. The transparent multilayer film laminate is then adhered to the encapsulant layer by the application of heat and optionally pressure or vacuum to form a photovoltaic module.

The solar cell layer may be significantly thicker, with somewhat uneven surfaces with peaks and voids, than the other layers and irregular in shape, including spaces or voids between and around the solar cells and other components of the solar cell layer. Therefore, portions of the second film layer of the transparent multilayer film laminate will contact the encapsulant layer outside the perimeter of the solar cell layer and can be adhered when heat is applied. As used herein, the perimeter of the solar cell layer is the outline of the outer limits of the area encompassed by the solar cell layer. In many cases, it is desirable that the second film layer and/or the encapsulant layer flow into the spaces and closely encapsulate the solar cells and other components to physically consolidate the photovoltaic module. Therefore, during the lamination process, the second film layer and/or encapsulant sheet composition will melt or soften to some degree, and will typically flow around the peaks and fill the voids of the solar cell assembly.

Thus, it may be necessary to apply heat for a period of time sufficient to allow such flow, which may be longer than that needed for adhering thinner layers of a more regular shape. For example, heat may be applied in such a manner that the transparent multilayer film laminate is maintained above the softening point of the second film layer thereof or above the softening point of the additional encapsulant layer, whichever is higher, for 5 to 30 minutes to effectively consolidate the photovoltaic module.

Accordingly, when the thickness of the second film layer and/or additional encapsulant layer is provided herein, unless otherwise specified in limited circumstances, it is the thickness of the layer prior to lamination. In general, however, the second film layer and/or the encapsulant layer in the final module remains at an average total thickness of about 1 to about 120 mils (about 0.025 to about 3 mm), or about 10 to about 90 mils (about 0.25 to about 2.3 mm), or about 15 to about 60 mils (about 0.38 to about 1.5 mm), or about 15 to about 45 mils (about 0.38 to about 1.14 mm), or about 15 to about 35 mils (about 0.38 to about 0.89 mm).

The steps recited above may be accomplished using a vacuum lamination procedure similar to that described previously, with the modification that an encapsulant layer and a solar cell layer are included in a multilayer laminate structure with the transparent multilayer film structure that comprises the first perfluorinated copolymer resin film layer and the second film layer.

In many cases, photovoltaic modules may be prepared as described above, in which a transparent multilayer film laminate comprising a fluorinated copolymer resin film layer and a second film layer is prepared (an integrated frontsheet), and subsequently assembled in combination with other layers into a photovoltaic module by application of heat and optionally pressure or vacuum.

Another embodiment includes contacting a surface of the second film layer with a fluorinated copolymer resin film to form a film overlay structure, overlaying a solar cell layer with the film overlay structure such that the second film layer is positioned such that portions of the second film layer extend beyond the perimeter of the solar cell layer and contact an encapsulant layer and then applying heat and optionally pressure or vacuum to adhere the various layers to each other simultaneously.

The methods described above may also include those wherein an additional layer is adhered to the surface of the encapsulant layer opposite the surface that contacts portions of the surface of the second film layer. The additional layer may be adhered to the encapsulant layer prior to, simultaneously with, or subsequently to contacting and adhering the second film layer to the above-described encapsulant layer.

For example, the encapsulant layer may be part of an integrated backsheet in which the encapsulant layer is adhered to an additional layer prior to contacting and adhering to the second film layer. Alternatively, the encapsulant layer may be contacted with the second film layer of the transparent multilayer film structure on one surface and another layer, such as a backsheet, on the opposite surface and adhered to both layers simultaneously, or the encapsulant layer may be adhered to the second film layer of the transparent multilayer film structure and then adhered to another layer, such as a backsheet.

In some cases, the encapsulant layer may also be surface treated with an organosilane coupling agent such as an aminosilane to improve adhesion to the second film layer and/or the additional layer.

In any of these cases, the second film layer of the transparent multilayer film laminate may be part of an integrated frontsheet in combination with the first fluorinated copolymer resin film layer, or the first fluorinated copolymer resin film layer and second ethylene terpolymer film layer may adhered at the same time that the second ethylene terpolymer film layer of the transparent multilayer film laminate is adhered to the encapsulant layer.

The methods described above provide multilayer films and photovoltaic modules characterized by an average peel strength between the first film layer and the second film layer of greater than 5 lbf/in, measured after exposing the film or photovoltaic module to conditions of 85° C. and 85% relative humidity (damp heat) for 1000 hours.

In a typical photovoltaic module construction, the solar cell layer is positioned between two encapsulant layers, which are further positioned between the frontsheet (or incident layer) and backsheet layers. In the methods described herein, a layer comprising a fluorinated copolymer resin film composition of a transparent multilayer film laminate serves as the frontsheet of a photovoltaic module and the second film layer of the transparent multilayer film laminate serves as an encapsulant layer. The combination may be provided in the form of the transparent multilayer film laminate described herein, also known as an integrated front sheet. As previously described, the second film layer and an additional encapsulant layer sandwich the solar cell layer and another layer (a backsheet layer) may also be adhered to the additional encapsulant layer.

Photovoltaic modules prepared by the methods described herein include, but are not limited to, wafer-based solar modules (e.g., c-Si or mc-Si based solar cells, as described above) and thin film solar modules (e.g., a-Si, μc-Si, CdTe, CIS, CIGS, light absorbing dyes, or organic semiconductor based solar cells). Within the solar cell layer, the solar cells may be electrically interconnected and/or arranged in a flat plane. In addition, the solar cell layer may further comprise electrical wiring, such as cross ribbons and bus bars.

Monocrystalline silicon (c-Si), poly- or multi-crystalline silicon (poly-Si or mc-Si) and ribbon silicon are the materials used most commonly in forming traditional wafer-based solar cells. Photovoltaic modules derived from wafer-based solar cells often comprise a series of self-supporting wafers (or cells) that are soldered together. The wafers generally have a thickness of between about 180 and about 240 μm.

Thin film solar cells are commonly formed from materials that include amorphous silicon (a-Si), microcrystalline silicon (μc-Si), cadmium telluride (CdTe), copper indium selenide ($CuInSe_2$ or CIS), copper indium sulfide, copper indium/gallium diselenide ($CuIn_xGa_{(1-x)}Se_2$ or CIGS), copper indium/gallium disulfide, light absorbing dyes, and organic semiconductors. Thin film solar cells with a typical thickness of less than 2 μm are produced by depositing the semiconductor layers onto a superstrate or substrate formed of glass or a flexible film.

The polymeric materials used in the second film layer may be the same as, or different from, the polymeric material used in any optional additional encapsulant layer that may be present in the transparent multilayer film laminates and photovoltaic modules. Any optional additional encapsulant layers used in preparing transparent multilayer film and photovoltaic modules described herein may each comprise a polymeric material independently selected from the group consisting of olefin unsaturated carboxylic acid copolymers, ionomers of olefin unsaturated carboxylic acid copolymers, ethylene vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and ethylenically unsaturated carboxylic acid esters (e.g. ethylene methyl acrylate copolymers and ethylene butyl acrylate copolymers), silicone elastomers, epoxy resins, and combinations of two or more thereof.

The optional encapsulant layer may preferably comprise a thermoplastic polymer selected from the group consisting of olefin α,β-unsaturated carboxylic acid copolymers, ionomers of olefin α,β-unsaturated carboxylic acid copolymers, and combinations thereof (i.e. a combination of two or more olefin α,β-unsaturated carboxylic acid copolymers, a combination of two or more ionomers of olefin α,β-unsaturated carboxylic acid copolymers, or a combination of at least one α,β-unsaturated carboxylic acid copolymer with one or more ionomers of α,β-unsaturated carboxylic acid copolymers).

The olefin α,β-unsaturated carboxylic acid copolymers used as additional encapsulant layers herein may be copolymers of an α-olefin having 2 to 10 carbons and an α,β-ethylenically unsaturated carboxylic acid having 3 to 8 carbons. For example, the acid copolymer may comprise about 15 to about 30 weight % of copolymerized units of the α,β-ethylenically unsaturated carboxylic acid, based on the total weight of the copolymer.

Suitable α-olefin comonomers include, but are not limited to, ethylene, propylene, 1-butene, 1-pentene, 1-hexene, 1-heptene, 3-methyl-1-butene, 4-methyl-1-pentene, and the like and combinations of two or more of such comonomers. Preferably, the α-olefin is ethylene.

Suitable α,β-ethylenically unsaturated carboxylic acid comonomers include, but are not limited to, acrylic acids, methacrylic acids, itaconic acids, maleic acids, fumaric acids, monomethyl maleic acids, and combinations of two or more thereof. Preferably, the α,β-ethylenically unsaturated carboxylic acid is selected from the group consisting of acrylic acids, methacrylic acids, and combinations of two or more thereof.

In certain embodiments, the acid copolymers will not comprise comonomers other than the α-olefins and the α,β-ethylenically unsaturated carboxylic acids. As such, the copolymers may be dipolymers of the acid copolymer comprising about 15 to about 30 weight % of copolymerized units of the α,β-ethylenically unsaturated carboxylic acid, based on the total weight of the copolymer, the remainder being an α-olefin, preferably ethylene.

Alternatively, the acid copolymers may further comprise copolymerized units of other comonomer(s) in addition to the α,β-ethylenically unsaturated carboxylic acid and the α-olefin, such as derivatives of unsaturated carboxylic acids having 2 to 10, or preferably 3 to 8 carbons. Suitable acid derivatives include acid anhydrides (such as maleic anhydride), amides, and esters. Preferably, the acid derivatives are esters. Specific examples of esters of unsaturated carboxylic acids include, but are not limited to the carboxylic acid esters described above for the ethylene ester copolymer. Preferably, the esters of unsaturated carboxylic acids are alkyl acrylates or alkyl methacrylates.

Ionomers of acid copolymers are ionic, neutralized derivatives of precursor acid copolymers, such as those acid copolymers disclosed above. Ionomers of α,β-unsaturated carboxylic acid copolymers may be produced by neutralizing the acid groups of the precursor acid copolymers with a reactant that is a source of metal ions in an amount such that neutralization of about 10% to about 60%, or about 20% to about 55%, or about 35% to about 50% of the carboxylic acid groups takes place, based on the total carboxylic acid content of the precursor α,β-unsaturated carboxylic acid copolymers as calculated or measured for the non-neutralized precursor acid copolymers. Neutralization may often be accomplished by reaction of the precursor acid polymer with a base, such as sodium hydroxide, potassium hydroxide, or zinc oxide.

The metal ions may be monovalent ions, divalent ions, trivalent ions, multivalent ions, or combinations of two or more thereof. Useful monovalent metallic ions include but are not limited to sodium, potassium, and lithium. Useful divalent metallic ions include but are not limited to beryllium, magnesium, calcium, strontium, barium, copper, iron, cobalt, and zinc. Useful trivalent metallic ions include but are not limited to aluminum, scandium, iron, and yttrium. Useful multivalent metallic ions include but are not limited to titanium, zirconium, hafnium, vanadium, tantalum, tungsten, cerium, and iron. When the metallic ion is multivalent, complexing agents such as stearate, oleate, salicylate, and phenolate radicals may be included, as disclosed in U.S. Pat. No. 3,404,134. Preferably, the metal ions are monovalent or divalent metal ions, such as metal ions selected from the group consisting of sodium, lithium, magnesium, zinc, potassium and combinations of two or more thereof. Notably, the metal ions are selected from sodium, zinc, and combinations thereof. For example, the metal ion is zinc.

Ionomers useful herein include those available from DuPont under the tradename Surlyn® resins.

The compositions used in any optional additional encapsulant layer can also include copolymers, especially dipolymers, that comprise copolymerized units of ethylene and from about 5 to about 15% by weight of monoesters or diesters of $C_4$-$C_8$ unsaturated acids having at least two carboxylic acid groups (e.g. in the case of monoesters those diacids wherein one carboxyl group is esterified and the other is a carboxylic acid group) such as ethylene maleic acid monoester copolymers. Preferably, when the composition includes a monoester, the monoester comprises about 6 weight % to about 15 weight % of the random copolymerized units of the copolymer chain.

Examples of useful monoester comonomers include maleic acid monoesters, fumaric acid monoesters, citraconic acid monoesters and mixtures thereof. Maleic acid monoesters are also known as maleic half-esters or alkyl hydrogen maleates.

Copolymers of ethylene and maleic acid monoesters, more preferably maleic acid $C_1$-$C_4$ alkyl monoesters such as, for example, methyl, ethyl, n-propyl, isopropyl, and n-butyl monoesters are highly preferred, and copolymers of ethylene and maleic acid monoethyl ester (i.e. ethyl hydrogen maleate) are most preferred.

Also suitable for use in optional encapsulant layer are terpolymers comprising copolymerized units of ethylene; copolymerized units of a first polar comonomer selected from the group consisting of $C_1$-$C_4$ alkyl esters of butenedioic acids, such as mono and diesters of maleic acid; and copolymerized units of a second polar comonomer selected from the group consisting of vinyl acetate, $C_1$-$C_4$ alkyl acrylates and $C_1$-$C_4$ alkyl methacrylates. Preferred terpolymers include those having less than 10 weight % copolymerized units of the second polar comonomer, based on the weight of the terpolymer. Preferably, less than 5 weight copolymerized units of the second polar comonomer will be present, based on the weight of the terpolymer. Preferred monomers suitable for use as the second polar comonomer in the above-described terpolymer are acrylic acid esters and methacrylic acid esters of $C_1$ to $C_4$ alcohols. Methyl acrylate and butyl acrylate are particularly preferred examples of the second comonomer.

These ethylene dicarboxylic acid monoester and diester copolymers are obtained by a process of high-pressure free radical polymerization. They are direct or random copolymers, that is, copolymers polymerized by adding all monomers simultaneously. A high-pressure process suitable for preparing such copolymers is described, for example, in U.S. Pat. No. 4,351,931. This process provides mixtures of comonomers that react with each other to form the polymer chain to provide random copolymers having copolymerized units of all comonomers incorporated into the polymer backbone or chain.

The composition of the encapsulant layer may comprise an ethylene/vinyl acetate copolymer comprising copolymerized units of ethylene and vinyl acetate. These copolymers may comprise 25 to 35, preferably 28 to 33, weight % of vinyl acetate. The ethylene/vinyl acetate copolymer may MFR of about 0.1 to about 1000 g/10 minutes, or about 0.3 to about 30 g/10 minutes, as determined in accordance with ASTM D 1238 at 190° C. and 2.16 kg.

The ethylene vinyl acetate copolymer used in the encapsulant layer composition may be in the form of a single ethylene/vinyl acetate copolymer or a mixture of two or more different ethylene/vinyl acetate copolymers. By different ethylene/vinyl acetate copolymers is meant, for example, that the copolymers have different comonomer ratios. They may also be copolymers that have the same comonomer ratios, but different MFR due to having different molecular weight distributions.

Ethylene/vinyl acetate copolymers useful herein include those available from DuPont under the tradename Elvax® resins.

Alternatively, the additional encapsulant layer may comprise an olefin/alkyl acrylate copolymer comprising copolymerized units of an α-olefin and an alkyl acrylate or an alkyl methacrylate.

Suitable α-olefin comonomers in the ester copolymer may include, but are not limited to, ethylene, propylene, 1-butene, 1-pentene, 1-hexene, 1-heptene, 3-methyl-1-butene, 4-methyl-1-pentene, and the like and combinations of two or more of such comonomers. Preferably, the α-olefin is ethylene.

Examples of esters of unsaturated carboxylic acids that are suitable comonomers include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, poly (ethylene glycol)acrylates, poly(ethylene glycol)methacrylates, poly(ethylene glycol)methyl ether acrylates, poly (ethylene glycol)methyl ether methacrylates, poly(ethylene glycol)behenyl ether acrylates, poly(ethylene glycol)behenyl ether methacrylates, poly(ethylene glycol) 4-nonylphenyl ether acrylates, poly(ethylene glycol) 4-nonylphenyl ether methacrylates, poly(ethylene glycol)phenyl ether acrylates, poly(ethylene glycol)phenyl ether methacrylates, dimethyl maleates, diethyl maleates, dibutyl maleates, dimethyl fumarates, diethyl fumarates, dibutyl fumarates, dimethyl fumarates, and combinations of two or more thereof. Preferably, the esters of unsaturated carboxylic acids are alkyl acrylates or alkyl methacrylates.

More preferably, the ester copolymer may be an ethylene/alkyl acrylate copolymer comprising copolymerized units of ethylene and copolymerized units of an alkyl acrylate. The alkyl moiety of the alkyl acrylate may contain 1 to 8 or 1 to 4 carbon atoms, such as methyl, ethyl, and branched or unbranched propyl, butyl, pentyl, and hexyl groups. Exemplary alkyl acrylates include, but are not limited to, methyl acrylate, ethyl acrylate, iso-butyl acrylate, and n-butyl acrylate. The polarity of the alkyl acrylate comonomer may be manipulated by changing the relative amount and identity of the alkyl group present in the comonomer. Similarly, a $C_1$-$C_6$ alkyl methacrylate comonomer may be used as a comonomer. Such comonomers include methyl methacrylate, ethyl methacrylate, i-butyl methacrylate, and n-butyl methacrylate. These copolymers may comprise 20 to 40, preferably 24 to 35, weight % alkyl acrylate. A notable copolymer comprises copolymerized units of ethylene and copolymerized units of n-butyl acrylate.

The ethylene/alkyl acrylate copolymers and ethylene/alkyl methacrylate copolymers may have melt flow rates ranging from about 0.1 to about 200 g/10 minutes, as determined in accordance with ASTM D 1238 at 190° C. and 2.16 kg, and therefore suitable ethylene/alkyl acrylate copolymers and ethylene/alkyl methacrylate copolymers can vary significantly in molecular weight.

The ester copolymer may be in the form of a single ethylene/alkyl acrylate copolymer, a single alkyl methacrylate copolymer, or a mixture of any two or more different ethylene/alkyl acrylate copolymers and/or ethylene alkyl methacrylate copolymers. Blends of at least one ethylene/alkyl acrylate copolymer and at least one ethylene/alkyl methacrylate copolymer are also contemplated.

The ethylene/alkyl acrylate copolymers and/or ethylene/alkyl methacrylate copolymers may be prepared by well known processes using either autoclave or tubular reactors. For example, the copolymerization can be conducted as a continuous process in an autoclave, where ethylene, the alkyl acrylate (or alkyl methacrylate), and optionally a solvent such as methanol (see U.S. Pat. No. 5,028,674) are fed continuously into a stirred autoclave such as the type disclosed in U.S. Pat. No. 2,897,183, together with an initiator. Alternatively, the ethylene/alkyl acrylate copolymer (or ethylene/alkyl methacrylate copolymer) may be prepared in a tubular reactor, according to the procedure described in the article "High Flexibility EMA Made from High Pressure Tubular Process" (Annual Technical Conference—Society of Plastics Engineers (2002), 60th (Vol. 2), 1832-1836). The ethylene/alkyl acrylate copolymer or ethylene/alkyl methacrylate copolymer also may be obtained in a high pressure, tubular reactor at elevated temperature with additional introduction of reactant comonomer along the tube. The ethylene/alkyl acrylate copolymer or ethylene/alkyl methacrylate copolymer also may be produced in a series of autoclave reactors wherein comonomer replacement is achieved by multiple zone introduction of reactant comonomer as taught in U.S. Pat. Nos. 3,350,372; 3,756,996; and U.S.Pat.No. 5,532,066.

Ethylene/alkyl acrylate copolymers useful herein include those available from DuPont under the tradename Elvaloy® AC.

The composition used in the encapsulant layer may further contain one or more additives, such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), silane coupling agents (described in greater detail above), dispersants, surfactants, chelating agents, coupling agents, reinforcement additives (e.g., glass fiber), and fillers. Ethylene vinyl acetate copolymer compositions also frequently contain crosslinking agents such as organic peroxides. Any of these additives are generally present in amounts of no more than 20 weight % of the encapsulant composition, sometimes no more than 10 weight % and sometimes no more than 2 weight %.

Suitable backsheet layers comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, and ethylene-tetrafluoroethylene copolymers), and combinations of two or more thereof. The polymeric film may be non-oriented, or uniaxially oriented, or biaxially oriented. A multilayer film of polyester (PET) sandwiched between two layers of polyvinyl fluoride (PVF) is a specific example of a backsheet. Although a multilayer film comprising a fluorinated copolymer resin first film layer adhered to an ethylene terpolymer second film layer prepared as described herein has been described above as an integrated frontsheet, it may alternatively be used as an integrated backsheet. When used as an integrated backsheet, such a transparent multilayer film laminate may be used in combination with a similar or identical transparent multilayer film laminate used as an integrated frontsheet or with frontsheets and/or encapsulant layers of different compositions.

In some embodiments, bifacial modules receive incident light from both sides of the device, incorporating a transparent layer on both front and back. For example, a transparent multilayer film laminate as described herein may be used as a first frontsheet of a bifacial device, while a glass layer is used as a transparent backsheet. Alternatively for a flexible bifacial module, transparent multilayer film laminates as described herein may be used on both sides of the device, in which the compositions of each sheet may be the same or different. For example, an FEP transparent layer may be used as a frontsheet on one side of the device with an ETFE transparent layer used on the other side of the device, or FEP layers may be used on both sides of the device.

The photovoltaic module may further comprise other functional film or sheet layers (e.g., dielectric layers or barrier layers) embedded within the module. For example, poly(ethylene terephthalate) films coated with a metal oxide coating, such as those disclosed in U.S. Pat. Nos. 6,521,825 and 6,818,819 and European Patent EP1182710, may function as oxygen and moisture barrier layers in the transparent multilayer film laminates or photovoltaic modules.

If desired, a layer of fiber (scrim) may also be included between the solar cell layers and encapsulant layers to facilitate deaeration during the lamination process or to serve as reinforcement for the encapsulant layers. The fiber may be a woven or nonwoven glass fiber or a networked mat of connected fibers. The use of such scrim layers is disclosed in, e.g., U.S. Pat. Nos. 5,583,057; 6,075,202; 6,204,443; 6,320,115; and 6,323,416 and European Patent EP0769818.

Any of the foregoing embodiments of photovoltaic modules may be prepared using the methods described herein.

The invention has been described with reference to specific embodiments. However, one of ordinary skill in the art appreciates that one or more modifications or one or more other changes can be made without departing from the scope of the invention as set forth in the claims below. Accordingly, the specification is to be regarded in an illustrative rather than a restrictive sense and any and all such modifications and other changes are intended to be included within the scope of invention.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any sub-combination.

The invention is further described in specific embodiments in the Examples which do not limit the scope of the invention described in the claims and wherein all amounts are expressed as parts by weight or weight percentages unless otherwise stated.

EXAMPLES

Materials

ACR-1: a terpolymer containing 66.9 weight % copolymerized ethylene units, 23.5 weight % copolymerized n-butyl acrylate units and 9.6 weight % copolymerized methacrylic acid units, MFR 25 g/10 minutes at 190° C., 2.16 kg as measured in accordance with ASTM D 1238.

ACR-2: a terpolymer containing 65.2 weight % copolymerized ethylene units, 28 weight % copolymerized n-butyl acrylate units and 6.2 weight % copolymerized acrylic acid units, MFR 210 g/10 minutes at 190° C., 2.16 kg as measured in accordance with ASTM D 1238.

ACR-3: a terpolymer containing 65.2 weight % copolymerized ethylene units, 28 weight % copolymerized n-butyl acrylate units and 6.2 weight % copolymerized acrylic acid units, MFR 60 g/10 minutes at 190° C., 2.16 kg as measured in accordance with ASTM D 1238.

EBAGMA-1: a terpolymer containing 66.75 weight % copolymerized ethylene units, 28 weight % copolymerized n-butyl acrylate units and 5.25 weight % copolymerized glycidyl methacrylate units, MFR 12 g/10 minutes at 190° C., 2.16 kg as measured in accordance with ASTM D 1238.

EBAGMA-2: a terpolymer containing 64 weight % copolymerized ethylene units, 25 weight % copolymerized n-butyl acrylate units and 9 weight % copolymerized glycidyl methacrylate units, MFR 8 g/10 minutes at 190° C., 2.16 kg as measured in accordance with ASTM D 1238.

EBA-1: an ethylene/n-butyl acrylate dipolymer containing 73 weight % copolymerized ethylene units and 27 weight % copolymerized n-butyl acrylate units, MFR 4 g/10 minutes at 190° C., 2.16 kg, measured according to ASTM D 1238.

EMAME-1: an ethylene/ethyl hydrogen maleate dipolymer containing 91.5 weight % copolymerized ethylene units and 9.5 weight % copolymerized ethyl hydrogen maleate units, MFR 25 g/10 minutes at 190° C. 2.16 kg measured in accordance with ASTM D 1238.

ION-2: An ethylene/methacrylic acid copolymer containing 85 weight % copolymerized ethylene units and 15 weight % copolymerized methacrylic acid units 23% nominally neutralized to Zn salts, melt flow rate 5.5 g/10 minutes at 190° C., 2.16 kg, measured in accordance with ASTM D 1238.

APTMS: 3-aminopropyltrimethoxysilane, available from Sigma-Aldrich Co., catalog number 28,177-8

MAOTMS: methacryloyloxypropyltrimethoxysilane, available from Sigma-Aldrich Co.

FEP-1: A film, corona treated on one side, comprising a tetrafluoroethylene-hexafluoropropylene copolymer (7.2 to 8.1 weight % copolymerized units HFP, 1.5 to 1.8 weight % copolymerized units PEVE and 90.1 to 91.3 weight % copolymerized units TFE), nominal melt flow rate 6 to 8 μm/10 minutes as defined in ASTM D 2116 and melting between 260° C. and 270° C., designated as PV3151, available from DuPont.

FEP-2: A film comprising a tetrafluoroethylene-hexafluoropropylene copolymer (7.2 to 8.1 weight % copolymerized units HFP, 1.5 to 1.8 weight % copolymerized units PEVE and 90.1 to 91.3 weight % copolymerized units TFE), nominal melt flow rate 6 to 8 μm/10 minutes as defined in ASTM D 2116 and melting between 260° C. and 270° C., designated as FEP 200A, available from DuPont. This film was not corona treated.

ETFE-1: A film, corona treated on one side, comprising an ethylene-tetrafluoroethylene copolymer (76.5 to 80.1 weight % copolymerized units TFE, 17.8 to 19.6 weight % copolymerized units ethylene and 2.1 to 3.9 weight % copolymerized units PFBE), designated as PV3251, available from DuPont.

ETFE-2: A film comprising an ethylene-tetrafluoroethylene copolymer (76.5 to 80.1 weight % copolymerized units TFE, 17.8 to 19.6 weight % copolymerized units ethylene and 2.1 to 3.9 weight % copolymerized units PFBE), designated as ETFE 200LZ, available from DuPont. This film was not corona treated.

Bixcure®: A commercial EVA encapsulant sheet comprising an ethylene/vinyl acetate dipolymer blended with a proprietary modifier package including a crosslinking agent, an adhesion promoter, and various stabilizers available from Bixby International Corporation, One Preble Road, Newburyport, Mass. USA 01950. The sheet was stored in a freezer as received until it was used in the laminations.

Examples 1-3 and Comparative Examples C1-C6

Preparation of Non-fluorinated Polymer Films

Formulations were prepared from the components listed in Table 1, where the amount of each component in the composition is listed in "parts". The components of Comparative Example C3 were melt blended in an extruder and collected as pellets. Compositions that included the silane coupling agents APTMS or MAOTMS (Comparative Examples C5 and C6) were prepared by mixing polymer pellets with the liquid silane additives and permitting the pellets to imbibe the additives. The modified pellets were fed to a twin screw extruder for preparing extruded polymer sheet compositions.

Sheets of the compositions were then formed by extrusion casting or press molding.

For extrusion casting, the polymer pellets were fed to a single screw or twin screw extruder, melted, conveyed, and forced through a suitably shaped (e.g., linear slot) die to produce the desired cross-sectional sheet shape. After extrusion through the die, the polymeric sheets were cast onto a water-cooled chilled roll for solidification, collected by winding on cardboard cores and stored for later laminations. Table 1 summarizes the extrusion casting conditions. In Table 1, "TS" indicates twin screw extruder and "SS" indicates single screw extruder.

For press molding of Examples 2 and 3, 6 inch×6 inch×20 mil plaques were prepared from pellets held at 185° C. under a pressure of between 2000 and 3000 tons for three minutes in a suitably shaped mold using a hydraulic press ("HP" in Table 1).

with a corona-treated surface of the fluorinated copolymer resin film such that it was sandwiched between the foil and the fluorinated copolymer resin film.

TABLE 1

|  | C1 | C2 | C3 | 1 | 2 | 3 | C4 | C5 | C6 |
|---|---|---|---|---|---|---|---|---|---|
| Component |  |  |  |  |  |  |  |  |  |
| Bixcure® | 100 |  |  |  |  |  |  |  |  |
| ION-2 |  | 100 |  |  |  |  |  |  |  |
| EMAME-1 |  |  | 20 |  |  |  |  |  |  |
| EBA-1 |  |  | 80 |  |  |  | 100 | 99.6 | 99.6 |
| ACR-1 |  |  |  | 100 |  |  |  |  |  |
| EBAGMA-1 |  |  |  |  | 100 |  |  |  |  |
| EBAGMA-2 |  |  |  |  |  | 100 |  |  |  |
| MAOTMS |  |  |  |  |  |  |  | 0.4 |  |
| APTMS |  |  |  |  |  |  |  |  | 0.4 |
| MFR |  |  |  |  |  |  |  |  |  |
| (g/10 minutes) | NA | 5.5 | 10 | 25 | 12 | 8 |  | 4 |  |
| Melting point (° C.) | 56 | 94 | 103 | 76 | 70 | 77 | 94 |  |  |
| Sheet forming conditions |  |  |  |  |  |  |  |  |  |
| Cast Extrusion | — | TS | SS | SS | — | — | TS | TS | TS |
| Melt temp (° C.) | — | 184 | 186 | 171 | — | — | 185 | 177 | 177 |
| Chill roll temp (° C.) | — | 20 | 7 | 24 | — | — | 15 | 30 | 30 |
| Extruder rpm | — | 150 | 55 | 56 | — | — | 100 | 80 | 80 |
| Press Molding |  |  |  |  | HP | HP |  |  |  |
| Sheet thickness (mil) | 20 | 15 | 20 | 20 | 20 | 20 |  | 15 | 18 | 18 |

Fluorinated Copolymer Resin Films

Commercially available films of FEP-1 and ETFE-1 as received from the manufacturer were used to form laminates of the compositions described in Table 1. For some examples, the surfaces of the FEP-1 films were also treated with aminosilane solutions according to the following surface treatment procedure. Coating solutions were prepared by dissolving 3-aminopropyltrimethoxysilane (APTMS) in the solvents listed in Table 2. The solutions were coated onto the FEP-1 film moving at a rate of 20 ft/min using a 200 quad gravure roll and the coated films were dried in a 10 ft oven (30 second residence time) set at 190° F. Dried films were available for immediate lamination or stored for later lamination.

TABLE 2

Lamination of Fluorinated Resin Films and Non-Fluorinated Polymer Films

|  | Solvent | APTMS in Solution (weight %) |
|---|---|---|
| FEP-1A | 95% ethanol/5% deionized water | 0.1 |
| FEP-1B | n-propanol | 0.5 |

Multilayer film laminates were prepared for the purpose of adhesion strength testing. The non-fluorinated polymer film samples were directly laminated to fluorinated copolymer resin films, the fluorinated copolymer resin films forming a flexible top sheet. A foil substrate was used as a bottom sheet. A laminator with a platen, enclosure and bladder was used as the lamination device.

Sample sheets (films) were prepared as described above from the compositions in Table 1. The fluorinated copolymer resin films used as the flexible top sheet included ETFE or FEP that had been corona treated prior to lamination (i.e. ETFE-1 or FEP-1), or both corona treated and surface treated with aminosilane as described above (FEP-1A or FEP-1B).

The multilayer test structures were assembled at room temperature. For each, the sample film was placed in contact The laminated area of the samples was 8 inches by 8 inches. A small piece of polyester film slip sheet was placed between the fluorinated copolymer resin film and the sample film at one end of the overlay to provide an unlaminated (unadhered) region to serve as an initiation point for subsequent peel tests. After assembly of a sample, it was placed with the foil backsheet atop an untreated 10 mil thick Teflon® release sheet and five heat resistant layers made of Sontara® Z-11 spunlaced fabric comprising Kevlar® aramid fibers (1.8-2.0 oz/yard, available from DuPont (Wilmington, Del.). Another 10 mil Teflon® release sheet was placed atop the multilayer laminate structure test sample. The purpose of the heat resistant layers was to slow the heating rate during the lamination so that the sample layer was not softened before all the air escaped from the area between the film layer interfaces, thus avoiding formation of air pockets and other defects. The release sheets prevented any material that might have flowed from the multilayer laminate structure from adhering to parts of the laminator.

The assembly consisting of the multilayer film overlay, heat resistant layers and Teflon® release sheets was then placed onto the platen with the foil facing the platen, which was preheated to a temperature of 150° C. and maintained at 150° C. throughout the lamination process. Immediately after placing the assembly on the platen, the enclosure of the laminator was lowered into place, sealed and the region surrounding the sample between the platen and enclosure of the laminator was evacuated over approximately six minutes to a pressure of 1 mbar to further assist in prevention of voids, defects, and air pockets. The rubber bladder was then inflated over a period of approximately one minute to a pressure of 999 mbar to provide pressure on the sample and other layers and ensure good thermal contact with the platen. The enclosure pressure (1 mbar), bladder pressure (999 mbar), and the temperature of the platen (150° C.) were held constant for approximately 13 minutes or longer, depending on the sample composition and number of heat resistant layers. The heating ensured that the sample film was softened so that it was in intimate conforming contact with the surface of the fluorinated copolymer resin film.

Following the lamination period, the bladder was depressurized to 0 mbar (over 30 seconds). The enclosure was vented to atmospheric pressure and the enclosure was opened. This operation required approximately thirty seconds. The samples and other layers were immediately removed from the platen and allowed to cool at room temperature for at least 10 minutes.

Samples for light transmission testing were similarly prepared using the sample films, except that the opaque foil substrate was replaced with a corona-treated FEP film to provide 3-layer structures: FEP/sample/FEP.

Sample size was four inches by four inches. Four sheets of Sontara® Z-11 spunbonded fabric were placed between the bottom platen and each sample to slow the heating rate. Glass plates above and below the 3-layer sample were used to maintain flatness and Teflon® sheets were placed above and below the glass plates to protect the laminator. The lamination was conducted using a four-minute evacuation period, one-minute pressurization period, and 30 minute hold period to accommodate heating of the glass plates.

Test Methods

Melt Flow Rate

Melt flow rates (MFR) reported herein were determined in accordance with the methods described in the Materials section above.

Damp Heat Exposure

Multilayer film laminate samples were placed, suspended vertically from a shelf by clips, in a laboratory oven capable of providing controlled heat and humidity. The oven was then brought to a temperature of 85° C. and a relative humidity of 85%. For the duration of the test, the oven was kept "dark" (i.e. no internal illumination sources were used; some light may have entered through the observation window from the exterior of the oven). These conditions were maintained for a specified number of hours. Samples were removed and tested after exposures of 500 hours, 1000 hours and 2000 hours to estimate suitability for use in photovoltaic applications. One thousand hours at 85° C. and 85% relative humidity is the required exposure in many photovoltaic module qualification standards.

Peel Strength

Samples were prepared by passing a blade through the multilayer film laminate in a manner such that the fluorinated copolymer resin top sheet, the second non-fluorinated polymer film layer, and the foil backing layer of the laminate were sequentially cut. Parallel cuts were made that were separated by one inch. This provided 3-layer laminate samples that were one inch wide. The one-inch sections of the sample were cut so that the one inch width was parallel to the longest dimension of the fluorinated copolymer resin top sheet and the samples were taken from the interior of the laminated (adhered) region, not from areas near the edges of the laminated region. The cuts ran from the laminated region through the unlaminated section of the fluorinated copolymer resin sheet provided by the polyester slip sheet discussed above. The peel test used the boundary between the laminated and unlaminated areas of the sample as the initiation point for the peel test. Test samples of Example laminates and Comparative Example laminates were prepared similarly.

The multilayer laminated film samples were tested using a T-peel test according to the procedures of ASTM F 904-91 "Standard Test Method For Comparison Of Bond Strength Of Ply Adhesion Of Similar Laminates Made From Flexible Materials". When reporting results, the average force during the constant steady-state peel propagation is reported. Peel strength results were recorded only for clean peels when the fluorinated copolymer resin film layer completely peeled away from the second film layer and foil layers. In cases where the laminate fluorinated copolymer resin film layer broke before peeling occurred, or when the second film layer remained adhered to the fluorinated copolymer resin film layer and peeled away from the foil layer, no results were recorded.

Two multilayer film laminates were tested for each composition and each exposure condition. As many as six one inch width peel tests were performed for each laminate. The results are summarized in Tables 3 through 6, with average peel strength reported in lbf/in.

TABLE 3

Initial Adhesion

| | ETFE-1 | | FEP-1 | | FEP-1A | | FEP-1B | |
|---|---|---|---|---|---|---|---|---|
| | Mean | SD | Mean | SD | Mean | SD | Mean | SD |
| C1 | 21.994 | 0.590 | 12.940 | 2.690 | 14.018 | 0.827 | — | |
| C2 | 0.385 | 0.115 | 0.323 | 0.040 | 10.806 | 0.244 | — | |
| C3 | 23.934 | 0.386 | NA | NA | 15.357 | 0.561 | — | |
| 1 | 16.440 | 4.271 | 11.761 | 4.071 | — | | 20.714 | 1.722 |
| 2 | 23.520 | 2.112 | 14.850 | 1.160 | — | | 15.600 | 0.753 |
| 3 | 24.694 | 0.382 | 14.818 | 1.349 | — | | 19.050 | 1.183 |
| C4 | 6.12 | 0.76 | 1.445 | 0.182 | 6.03 | 2.409 | — | |
| C5 | 11.82 | 0.609 | 0.29 | 0.064 | 4.348 | 0.715 | — | |
| C6 | 0.607 | 0.648 | 2.35 | 0.568 | 0.776 | 0.180 | — | |

TABLE 4

Adhesion after 500 hours damp heat

| | ETFE-1 | | FEP-1 | | FEP-1A | | FEP-1B | |
|---|---|---|---|---|---|---|---|---|
| | Mean | SD | Mean | SD | Mean | SD | Mean | SD |
| C1 | 9.269 Yellow | 5.553 | 0.071 | 0.024 | 7.682 | 3.694 | — | |
| C2 | 1.774 | 0.461 | 0.270 | 0.031 | 8.117 | 5.410 | — | |
| C3 | 12.715 | 4.803 | 4.031 | 0.630 | 12.554 | 1.008 | — | |
| 1 | 22.828 | 0.414 | 15.969 | 1.894 | — | | 17.038 | 2.612 |
| 2 | 25.948 | 3.431 | 14.627 | 0.186 | — | | 16.035 | 0.331 |
| 3 | 23.543 | 0.392 | 14.618 | 0.343 | — | | 17.277 | 1.871 |
| C4 | 0.429 | 0.092 | 0.011 | 0.004 | 13.904 | 2.202 | — | |
| C5 | 14.827 | 0.677 | 4.807 | 0.983 | 9.730 | 1.034 | — | |
| C6 | 12.405 | 1.68 | NA | NA | 8.45 | 0.505 | — | |

TABLE 5

Adhesion after 1000 hours damp heat

| | ETFE-1 | | FEP-1 | | FEP-1A | | FEP-1B | |
|---|---|---|---|---|---|---|---|---|
| | Mean | SD | Mean | SD | Mean | SD | Mean | SD |
| C1 | 2.390 Yellowed | 0.400 | NA | NA | 13.691 | 0.949 | — | |
| C2 | 0.675 | 0.079 | NA | NA | 6.608 | 1.431 | — | |
| C3 | 5.764 | 0.725 | NA | NA | 5.334 | 1.268 | — | |
| 1 | 26.767 | 0.554 | 5.496 | 0.503 | — | | 17.038 | 2.809 |
| 2 | 28.059 | 4.734 | 16.559 | 0.680 | — | | 15.847 | 1.239 |
| 3 | 23.928 | 0.432 | 17.824 | | — | | 15.637 | 0.662 |
| C4 | 5.381* | 3.366 | 1.535* | 0.122 | 1.551 | 0.065 | — | |
| C5 | 7.766* | 2.715 | 2.284* | 0.234 | 3.336 | 1.01 | — | |
| C6 | 14.6* | 1.404 | 8.015* | 0.847 | 8.346 | 0.383 | — | |

*time extended beyond 1000 hours

TABLE 6

Adhesion after 2000 hours damp heat

| | ETFE-1 | | FEP-1 | | FEP-1A | | FEP-1B | |
|---|---|---|---|---|---|---|---|---|
| | Mean | SD | Mean | SD | Mean | SD | Mean | SD |
| C1 | 15.511 Yellow, delaminated | 8.076 | NA | NA | 0.904 | 0.502 | | |
| C2 | 0.444 | 0.023 | NA | NA | 0.336 | 0.018 | | |
| C3 | 1.936 | 1.290 | NA | NA | 0.371 Yellow, crazed | 0.337 | | |
| 1 | 23.476 | 0.666 | 9.924 | 5.054 | — | | 14.181 | 1.623 |
| 2 | 23.969 | 2.727 | 14.927 | 0.713 | — | | 16.428 | 2.164 |
| 3 | 23.913 | 0.459 | 14.647 | 0.590 | — | | 15.709 | 1.220 |

Light Transmission

Light transmittance spectra were collected in accordance with ASTM E 424, Solar Energy Transmittance and Reflectance (Terrestrial) of Sheet Materials, Method A, for spectrophotometric determinations. This method compares the light transmitted through a specimen to that transmitted through air (paragraph 6.4.1) using an integrating sphere spectrophotometer (paragraph 6.1.1). Total solar energy transmittance for a sample, in percent, can be determined by integrating the spectral transmittance over the standard solar energy distribution by multiplying the transmittance at a given wavelength by energy weighted ordinates (paragraph 6.5.1). Essentially equivalent results (paragraph 1.1) can be obtained by Method B, using the sun as a light source and a pyranometer as a detector (paragraph 4.2).

For the samples listed in Table 7, light transmission data were determined using a Varian Cary 5000 UV/VIS/NIR spectrophotometer (version 1.12) equipped with a DRA-2500 diffuse reflectance accessory, scanning from 2500 nm to 200 nm in 1-nm increments, averaging for 0.2 second over each increment, utilizing full slit height and operating in double beam mode. The DRA-2500 is a 150 mm integrating sphere with a SPECTRALON reflective coating. A total transmittance spectrum was obtained for each sample. Light transmission levels for selected wavelengths of the samples are reported in Table 7 as a percentage of transmission compared to the light transmitted through air.

TABLE 7

Light Transmission Levels (%)

| Example | % Transmission at 600 nm | Example | % Transmission at 600 nm |
|---|---|---|---|
| C1 | 93.9 | 1 | 92.2 |
| C2 | 92.5 | 2 | 92.8 |
| C3 | 85.6 | 3 | 91.0 |
| C5 | 89.2 | | |
| C6 | 88.6 | | |

Additional lamination trials were conducted using untreated and corona-treated ETFE and FEP films laminated to Bixcure®, EBAGMA-1 and EBAGMA-2 films. The films without silane or any other primers were laminated to test fluoropolymer sheets. Sample size was four inches by six inches. Samples were positioned in an oven in order from bottom to top: first glass plate, sample second layer, fluorinated copolymer resin film first layer, Teflon® release sheet and second glass plate. A small piece of Teflon® film release sheet was placed between the fluorinated copolymer resin film and the sample second layer at one end of the overlay to provide an unlaminated (unadhered) region to serve as an initiation point for subsequent peel tests. The samples were heated from ambient to 165° C. (oven set temperature) and held for 1 hour. At that time the oven heat was turned off and the sample was cooled to ambient temperature by opening the oven door.

The adhesion between the second film layer and the fluorinated copolymer resin first film layer was tested by a 180 degree peel test, measured on 1-inch strips of the laminate with an Instron (model 1122), with a peel rate of 100 mm/min, peel angle of 180 degrees, initially after lamination and after treatment at 100% relative humidity and 50° C. for a designated time as described above. Samples were also soaked by total immersion in water at ambient temperature (about 20° C.) for 1176 hours.

Trials using non-corona treated films FEP-2 and ETFE-2 did not provide initial adhesion for Bixcure®, EBAGMA-1 and EBAGMA-2 films. Trials with corona-treated films FEP-1 and ETFE-1 with Bixcure®, EBAGMA-1 and EBAGMA-2 films provided excellent adhesion for all films initially and after heat treatment for 72, 312, 1320 and 1512 hours and after the water immersion test, providing nonpeelable adhesion between the fluorinated copolymer resin layer and the second layer. "Nonpeelable" indicates that the layers could not be peeled apart without destruction of the fluorinated copolymer resin layer.

What is claimed is:

1. A transparent multilayer film laminate comprising:
   A. a first film layer comprising a fluorinated copolymer resin composition wherein i) the fluorinated copolymer comprises copolymerized units of tetrafluoroethylene and at least one comonomer selected from the group consisting of ethylene, perfluorinated comonomers, and combinations thereof, and ii) at least one surface of the first film layer has been modified by a surface treatment;
   B. a second film layer comprising a polymeric material comprising a terpolymer consisting essentially of copolymerized units of i) ethylene; ii) a first olefin of the formula $CH_2=C(R^1)CO_2R^2$, wherein $R^1$ is hydrogen or an alkyl group having 1 to 8 carbon atoms and $R^2$ is an alkyl group having 1 to 8 carbon atoms; and iii) a second olefin of the formula $CH_2=C(R^3)D$, wherein $R^3$ is hydrogen or an alkyl group having 1 to 8 carbon atoms, and D is $-CO_2R^5-R^4$, wherein $R^4$ is a moiety containing an epoxy group and $R^5$ is an alkylene group having 1 to 8 carbon atoms;
   wherein a surface of the second film layer is adhered to the modified surface of the first film layer and the multilayer film laminate has an average peel strength between the first film layer and the second film layer of greater than 5 lbf/in, measured after exposing the multilayer film laminate to conditions of 85° C. and 85% relative humidity for 1000 hours.

2. The laminate of claim 1 wherein in the second film layer $R^4$ is a glycidyl group.

3. The laminate of claim 1 wherein in a second film layer ii) is butyl acrylate.

4. The laminate of claim 1 wherein in the second film layer iii) is glycidyl methacrylate.

5. A method for preparing the transparent multilayer film laminate of claim 1 comprising:
   A. providing a first film layer comprising a fluorinated copolymer resin composition wherein i) the fluorinated copolymer comprises copolymerized units of a) tetrafluoroethylene; and b) at least one comonomer selected from the group consisting of ethylene, perfluorinated comonomers, and combinations thereof, and ii) at least one surface of the first film layer has been modified by a surface treatment;

B. providing a second film layer comprising a polymeric material comprising a terpolymer consisting essentially of copolymerized units of i) ethylene; ii) a first olefin of the formula $CH_2$=$C(R^1)CO_2R^2$, wherein $R^1$ is hydrogen or an alkyl group having 1 to 8 carbon atoms and $R^2$ is an alkyl group having 1 to 8, carbon atoms, and iii) a second olefin of the formula $CH_2$=$C(R^3)D$, wherein $R^3$ is hydrogen or an alkyl group having 1 to 8 carbon atoms, and D is —$CO_2R^5$—$R^4$, wherein $R^4$ is a moiety containing an epoxy group and $R^5$ is an alkylene group having 1 to 8 carbon atoms;

C. contacting a surface of the second film layer with the modified surface of the first film layer; and D. adhering the first film layer to the second film layer by the application of heat and optionally pressure or vacuum.

6. The method of claim 5 wherein the modified surface of the first film layer is treated with an organosilane prior to contacting the surface of the second layer.

7. The method of claim 5 wherein in the second film layer $R^4$ is a glycidyl group.

8. The method of claim 5 wherein in the second film layer ii) is butyl acrylate —$CO_2R^5$—$R^4$.

9. The method of claim 5 wherein in the second film layer iii) is glycidyl methacrylate.

10. A method for preparing a photovoltaic module, the method comprising the steps:

A. providing a solar cell layer;

B. providing the multilayer film laminate according to claim 1 that is larger in area than the solar cell layer;

C. overlaying the solar cell layer with the multilayer film laminate such that
1. a surface of the second film layer of the multilayer film laminate contacts the solar cell layer;
2. a portion of the second layer of the multilayer film laminate extends beyond the perimeter of the solar cell layer; and
3. the portion of the second film layer of the multilayer film laminate that extends beyond the perimeter of the solar cell layer contacts another layer that is an encapsulant layer; and D. adhering the second film layer of the multilayer film laminate to the encapsulant layer by the application of heat and optionally pressure or vacuum to provide the photovoltaic module.

11. The method of claim 10 wherein the encapsulant layer comprises a polymeric material selected from the group consisting of ethylene acid copolymers, ionomers of ethylene acid copolymers, ethylene vinyl acetate copolymers, poly (vinyl acetals), polyurethanes, polyvinylchlorides, polyethylenes, polyolefin block copolymer elastomers, copolymers of α-olefins and α,β-ethylenically unsaturated carboxylic acid esters, silicone elastomers, epoxy resins, and combinations of two or more thereof.

12. The method of claim 10 wherein an additional layer is adhered to the surface of the encapsulant layer that is opposite the surface that contacts the surface of the second film layer.

13. The method of claim 10 wherein in the second film layer $R^4$ is a glycidyl group.

14. The method of claim 10 wherein in the second film layer ii) is butyl acrylate.

15. The method of claim 10 wherein in the second film layer iii) is glycidyl methacrylate.

* * * * *